(12) United States Patent
Heston et al.

(10) Patent No.: US 6,774,701 B1
(45) Date of Patent: Aug. 10, 2004

(54) METHOD AND APPARATUS FOR ELECTRONIC SWITCHING WITH LOW INSERTION LOSS AND HIGH ISOLATION

(75) Inventors: David D. Heston, Dallas, TX (US); John G. Heston, Murphy, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/369,782

(22) Filed: Feb. 19, 2003

(51) Int. Cl.[7] .............................................. H03K 17/62
(52) U.S. Cl. ....................... 327/408; 327/427; 333/103; 455/83
(58) Field of Search ................................ 327/407–413, 327/427, 436, 581, 376, 377, 308, 403, 404, 430, 431, 261, 281, 288; 303/101, 103; 455/83, 560, 277.1

(56) References Cited

U.S. PATENT DOCUMENTS

| | | | | |
|---|---|---|---|---|
| 4,694,208 A | * | 9/1987 | Szabo et al. ................ 327/261 |
| 5,748,053 A | * | 5/1998 | Kameyama et al. ........ 333/103 |
| 6,066,993 A | * | 5/2000 | Yamamoto et al. ......... 333/103 |
| 6,160,425 A | * | 12/2000 | Laurent et al. ............. 327/408 |
| 6,407,614 B1 | * | 6/2002 | Takahashi .................... 327/407 |
| 6,486,718 B1 | * | 11/2002 | Stelle et al. ................ 327/198 |
| 6,545,518 B2 | * | 4/2003 | Saeki ........................ 327/408 |

OTHER PUBLICATIONS

Tanaka, et al., "A 3V MMIC Chip Set for 1.9GHz Mobile Communication Systems", 1995 IEEE International Solid–State Circuit Conference, pp. 144–145 and 353, 1995.

* cited by examiner

*Primary Examiner*—Long Nguyen
(74) *Attorney, Agent, or Firm*—Baker Botts L.L.P.

(57) ABSTRACT

A switch circuit includes a first electronic switch coupled between two terminals, and a second electronic switch and a capacitor coupled in series between a reference voltage and a control input of the first electronic switch. A different switch circuit includes first and second electronic switches coupled in series between two terminals with a further terminal coupled to a node between the switches, a third electronic switch and a first capacitor coupled in series between a reference voltage and a control input of the first electronic switch, and a fourth electronic switch and a second capacitor coupled in series between a reference voltage and a control input of the second electronic switch.

43 Claims, 1 Drawing Sheet

METHOD AND APPARATUS FOR ELECTRONIC SWITCHING WITH LOW INSERTION LOSS AND HIGH ISOLATION

TECHNICAL FIELD OF THE INVENTION

This invention relates in general to an electronic switch and, more particularly, to an electronic switch in which one or more signal terminals can be selectively coupled to a further terminal.

BACKGROUND OF THE INVENTION

A known type of electronic switch circuit has two or more signal terminals, each of which is coupled to the same common terminal through a respective switching transistor. One application for a switch of this type is to effect switching of high power radio frequency (RF) signals in a cellular telephone. In a switch of this type, each switch transistor should provide low insertion loss when it is on, and high isolation when it is off. Trying to optimize both features can involve competing considerations. As one aspect of this, if a transistor is coupled to a signal terminal which in turn is coupled to circuitry with a low load impedance, maintaining high isolation while the transistor is off can be problematic.

Also, it is possible in a switch circuit of this type to increase the sizes of the switch transistors in order to increase the current and power handling capability of the switch circuit. Increasing the size of a switch transistor tends to reduce its insertion loss when it is on, but also tends to degrade the isolation which it provides when it is off, especially where its signal terminal is coupled to circuitry with a low load impedance. In a switch circuit of the type being discussed here, degradation in the isolation of a switch transistor which is off can act to degrade the insertion loss of another switch transistor which is on.

SUMMARY OF THE INVENTION

From the foregoing, it may be appreciated that a need has arisen for a method and apparatus for effecting electronic switching in a manner which facilitates both low insertion loss and high isolation. One form of the invention includes an apparatus that involves: first and second terminals; a first electronic switch coupled between the first and second terminals, the first electronic switch having a first control input; and a capacitor and a second electronic switch coupled in series between the first control input and a reference voltage, the second electronic switch having a second control input.

A different form of the invention includes an apparatus that involves: first, second and third terminals; first and second electronic switches coupled in series between the first and second terminals, the first electronic switch having a first control input and the second electronic switch having a second control input, and the third terminal being coupled to a node between the first and second electronic switches; a first capacitor and a third electronic switch coupled in series between the first control input and a reference voltage, the third electronic switch having a third control input; and a second capacitor and a fourth electronic switch coupled in series between the second control input and a reference voltage, the fourth electronic switch having a fourth control input.

Yet another form of the invention includes a method of controlling a circuit having a first electronic switch which is coupled between first and second terminals, and which has a first control input, where the method involves: providing a second electronic switch and a capacitor in series between the first control input and a reference voltage, the second electronic switch having a second control input; and selectively applying control voltages to each of the first and second control inputs.

Still another form of the invention includes a method of controlling a circuit having first and second electronic switches coupled in series between first and second terminals, and having a third terminal coupled to a node between the first and second electronic switches, the first and second electronic switches respectively having first and second control inputs, where the method includes: providing a third electronic switch and a first capacitor which are coupled in series between the first control input and a reference voltage; providing a fourth electronic switch and a second capacitor which are coupled in series between the second control input and a reference voltage; and selectively applying control voltages to each of the first, second, third and fourth control inputs.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
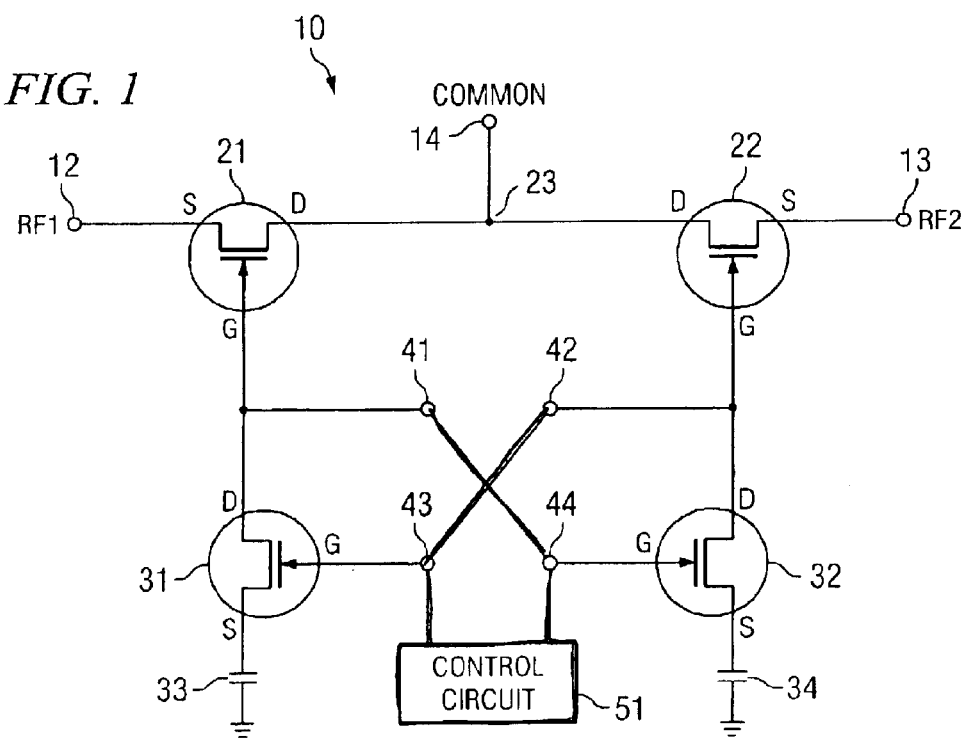
FIG. 1 is a schematic circuit diagram showing an electronic switch circuit which embodies aspects of the present invention.

FIG. 1 is a schematic circuit diagram of a switch circuit 10 which embodies aspects of the present invention. In FIG. 1, the switch circuit 10 is a portion of an integrated circuit which is utilized in a cellular telephone, and is implemented on a gallium arsenide (GaAs) semiconductor substrate. However, the switch circuit 10 could alternatively be implemented with discrete components or in some other semiconductor technology, such as complementary metal oxide semiconductor (CMOS) technology. Further the switch circuit 10 could alternatively be used in a wide variety of other applications.

The switch circuit 10 has two signal ports or terminals 12 and 13, and a common port or terminal 14. The circuit 10 can selectively couple the signal terminal 12 to the common terminal 14 while isolating the signal terminal 13 from the common terminal 14, or can selectively couple the signal terminal 13 to the common terminal 14 while isolating the signal terminal 12 from the common terminal 14. Thus, the circuit 10 is a device of the type generally referred to as a single pole double throw (SPDT) switch, or a single pole two throw (SP2T) switch. As mentioned above, the switch circuit 10 in FIG. 1 is part of a cellular telephone, and respective radio frequency (RF) signals RF1 and RF2 are respectively applied to the terminals 12 and 13. However, the circuit 10 is not restricted to RF applications.

The circuit 10 includes two switch transistors 21 and 22, which are coupled in series between the signal terminals 12 and 13. A node 23 between the switch transistors 21 and 22 is coupled to the common terminal 14. In FIG. 1, the switch transistors 21 and 22 are each a field effect transistor (FET) having a source "S", a drain "D", and a gate "G". However, the present invention does not preclude the use of some other type of transistor or electronic device instead of field effect transistors. In the drawing, each of the switch transistors 21 and 22 has its drain coupled to the node 23 and the common terminal 14, and its source coupled to a respective one of the signal terminals 12 and 13. However, it would alternatively be possible for each transistor 21 and 22 to have its source coupled to the common terminal 14, and its drain coupled to a respective one of the signal terminals 12 and 13. In FIG. 1, the transistors 21 and 22 each have a generally symmetric configuration, in which the gate is approximately centered between the source and drain. However, either or both of the transistors 21 and 22 could alternatively have an asymmetric configuration.

A gate transistor 31 and a gate capacitor 33 are coupled in series between the gate of transistor 21 and a reference voltage. In FIG. 1, this reference voltage is ground. Similarly, a gate transistor 32 and a capacitor 34 are coupled in series between the gate of transistor 22 and a reference voltage, which is ground. The gate transistors 31 and 32 are each an FET having a drain, a source and a gate. However, each could alternatively be some other type of transistor or electronic switching device.

In FIG. 1, the gate transistors 31 and 32 each have their drain coupled to the gate of a respective switch transistor 21 or 22, and their source coupled to a respective one of the capacitors 33 and 34. Alternatively, however, the gate transistors 31 and 32 could each have their source coupled to the gate of a respective switch transistor, and their drain coupled to a respective capacitor 33 or 34. In FIG. 1, the transistors 31 and 32 each have a generally symmetric configuration, in which the gate is approximately centered between the source and drain. However, either or both of the transistors 31 and 32 could alternatively have an asymmetric configuration.

The gates of the transistors 21–22 and 31–32 are each coupled to a respective one of four control terminals 41–44. A control circuit 51 has a first output which is coupled to the control terminals 43 and 42, and a second output which is coupled to the control terminals 44 and 41. In FIG. 1, the two outputs of the control circuit are each switched between levels of approximately 0.0 volts (ground) and +0.5 volts. Further, each of these outputs is the inverse of the other. In other words, when one output is switched to +0.5 volts, the other will be switched to 0.0 volts, and vice versa. Alternatively, the control circuit 51 could have four different outputs, each of which is used to control a respective one of the four control terminals 41–44.

The voltages of 0.0 volts and +0.5 volts discussed above are appropriate when the transistors 21–22 and 31–32 are enhancement mode transistors. However, the invention can be utilized with other types of transistors. For example, the invention can be utilized with depletion mode transistors, for which suitable voltages would be 0.0 volts and −3.0 volts.

The outputs of the control circuit 51 are designed for high impedance, in order to avoid loading down the transistors of the switch circuit 10. In FIG. 1, this is achieved by providing, within the control circuit 51, a respective not-illustrated resistor in series with each of the control outputs of the circuit 51.

The circuit 10 operates in the following manner. Assume that the control circuit 51 is applying a control voltage of +0.5 volts to each of the control terminals 44 and 41, and is applying a control voltage of 0.0 volts to each of the control terminals 43 and 42. The control voltage at the control terminal 41 will turn the switch transistor 21 on, so that the signal terminal 12 is coupled to the common terminal 14. The control voltage at the control terminal 42 will turn the switch transistor 22 off, so that the signal terminal 13 is isolated from the common terminal 14. The control voltage applied to the control terminal 43 will turn the gate transistor 31 off, thereby isolating the capacitor 33 from the gate of the switch transistor 21. Isolating the capacitor 33 from the gate of the switch transistor 21 in this manner improves the insertion loss of the gate transistor 21 while it is on, because the capacitor 33 is prevented from interacting with parasitic capacitances within the switch transistor 21 in a manner that would have the effect of degrading the insertion loss of the transistor 21. Meanwhile, the control voltage applied to the control terminal 44 will turn the gate transistor 32 on, so that the gate transistor 32 couples the capacitor 34 to the gate of the switch transistor 22.

To the extent that any RF energy leaks from the source or drain of the transistor 22 to the gate thereof, capacitor 34 serves as a shunt or bypass capacitor and couples the RF energy directly to ground. Consequently, the RF leakage energy cannot act on the gate of the transistor 22 in a manner that would tend to switch the transistor 22 out of its off state, which in turn would degrade the degree of isolation provided between the terminals 13 and 14 by the transistor 22, especially where the terminal 13 is coupled to a circuit with a relatively low load impedance. Consequently, in this particular operational mode, where the transistor 21 is on and the transistor 22 is off, the transistor 21 reliably provides a low insertion loss and the transistor 22 reliably provides high isolation. The transistor 22 provides this high isolation in a manner which is substantially independent of the load impedance of the circuitry to which the signal terminal 13 is coupled. This remains true even if the physical sizes of the switch transistors 21 and 22 are increased in order to provide increased power handling capacity within the circuit 10.

If the control circuit 51 then inverts each of its control signals, a control voltage of +0.5 volts will be applied to the control terminals 43 and 42, and a control voltage of 0.0 volts will be applied to the control terminals 44 and 41. Consequently, the transistors 22 and 31 will be on, and the transistors 21 and 32 will be off. The transistor 22 will be coupling the signal port 13 to the common terminal 14, and the transistor 21 will be providing isolation between the signal terminal 12 and the common terminal 14. The gate transistor 32 will be off in order to isolate the gate of the switch transistor 22 from the capacitor 34, so that the switch transistor 22 provides a low insertion loss. The gate transistor 31 will be coupling the gate of the switch transistor 21 to the capacitor 33, so that the switch transistor 21 provides high isolation.

As mentioned above, the disclosed circuit 10 is basically an electronic single pole two throw (SP2T) switch. This circuit 10 could be converted into a single pole three throw (SP3T) switch by providing a further not-illustrated signal port, a further switch transistor between the common terminal 14 and the further signal port, and a further gate transistor and further capacitor in series between ground and the gate of the further switch transistor. In a similar manner, the circuit 10 could be converted into a single pole four throw (SP4T) switch, for example by taking two circuits of the type shown at 10 in the drawing, and connecting the node 23 of one such circuit to the node 23 of the other. Generalizing this concept, it will be recognized that the circuit 10 of FIG. 1 could be readily converted into a single throw N throw (SPNT) switch, where N is an integer.

Figure 2:
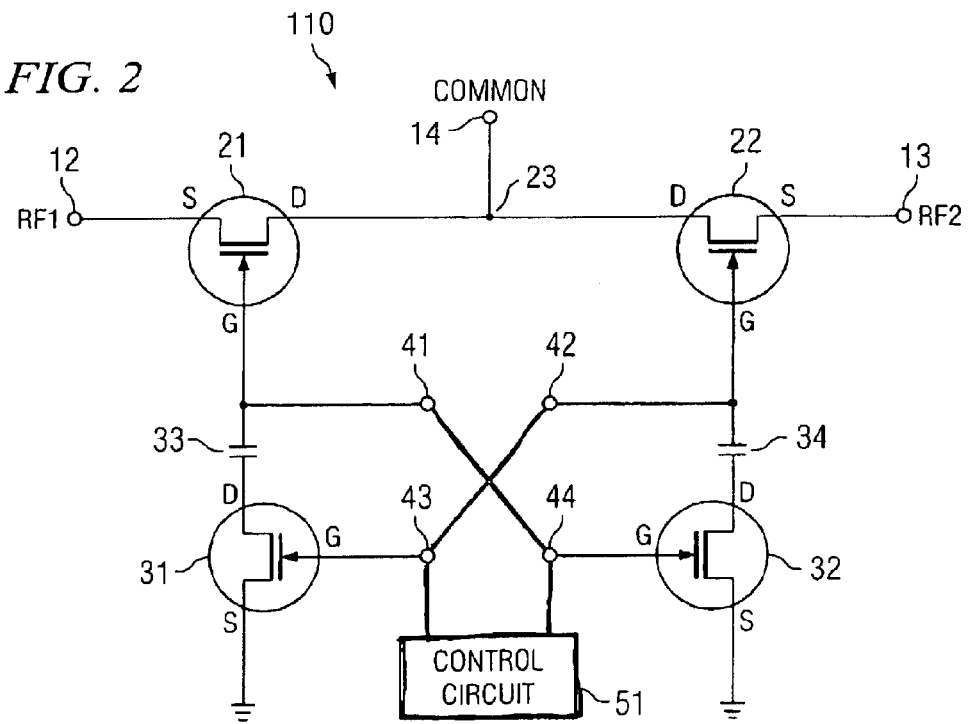
FIG. 2 is a schematic circuit diagram showing an electronic switch circuit which is an alternative embodiment of the circuit of FIG. 1.

FIG. 2 is a schematic diagram of a switch circuit 110 which is an alternative embodiment of the switch circuit 10 of FIG. 1. Equivalent parts are identified with the same reference numerals, and only the differences are described in detail here. The circuit 110 differs from the circuit 10 in that the capacitor 33 has been moved so that it is between the transistors 21 and 31, and the capacitor 34 has been moved so that it is between the transistors 22 and 32. This configuration provides separation of the bias voltages of transistors 21 and 31, and separation of the bias voltages of transistors 22 and 32. Further, where the circuits 10 and 110 are implemented as integrated circuits, and depending on the semiconductor technology used, the circuit 110 may utilize less area within an integrated circuit than the circuit 10. The operation of the circuit 110 is sufficiently similar to the operation of the circuit 10 so that the operation of the circuit 110 is not described in detail here.

The present invention provides a number of technical advantages. One such advantage is that a switch transistor provides low insertion loss when it is active, and high isolation when it is inactive, in a manner which is substantially indifferent to the load impedance of the circuitry to which the transistor is coupled. A further advantage is that the low insertion loss and high isolation are present even if the sizes of transistors in the switch circuit are increased in order to increase the power handling capacity.

Although selected embodiments have been illustrated and described in detail, it will be understood that various substitutions and alterations are possible without departing from the spirit and scope of the present invention as defined by the following claims.

What is claimed is:

1. An apparatus, comprising:
   first and second terminals;
   a first electronic switch coupled between said first and second terminals, said first electronic switch having a first control input; and
   a capacitor and a second electronic switch coupled in series between said first control input and a reference voltage, said second electronic switch having a second control input; and
   a control circuit operable to effect switching of an RF signal applied to the first terminal to the second terminal and isolate the first electronic switch from the capacitor by applying a first control signal to the first control input and a second control signal to the second control input.

2. An apparatus according to claim 1, wherein said electronic switches each include a transistor.

3. An apparatus according to claim 2, wherein said transistor of said first electronic switch is a field effect transistor, said first control input being a gate input thereof.

4. An apparatus according to claim 3, wherein said transistor of said second electronic switch is a field effect transistor, said second control input being a gate input thereof.

5. An apparatus according to claim 2, wherein said transistor of said second electronic switch is a field effect transistor, said second control input being a gate input therof.

6. An apparatus according to claim 1, wherein said capacitor is disposed electrically between said first control input and said second electronic switch.

7. An apparatus according to claim 1, wherein said second electronic switch is disposed electrically between said first control input and said capacitor.

8. An apparatus, comprising:
   first, second and third terminals;
   first and second electronic switches coupled in series between said first and second terminals, said first and second terminals for receiving first and second RF signals, respectively, said first electronic switch having a first control input and said second electronic switch having a second control input, and said third terminal being coupled to a node between said first and second electronic switches;
   a first capacitor and a third electronic switch coupled in series between said first control input and a first reference voltage, said third electronic switch having a third control input;
   a second capacitor and a fourth electronic switch coupled in series between said second control input and a second reference voltage, said fourth electronic switch having a fourth control input; and
   wherein said first capacitor is disposed electrically between said first control input and said third electronic switch, and said second capacitor is disposed electrically between said second control input and said fourth electronic switch.

9. An apparatus according to claim 8, wherein each of said electronic switches includes a transistor.

10. An apparatus according to claim 9, wherein said transistor of each of said first and second electronic switches is a field effect transistor, said first and second control inputs each being a gate input of a respective said transistor.

11. An apparatus according to claim 10,
    wherein said field effect transistor of said first electronic switch has a drain coupled to said third terminal and a source coupled to said first terminal; and
    wherein said field effect transistor of said second electronic switch has a drain coupled to said third terminal and a source coupled to said second terminal.

12. An apparatus according to claim 10, wherein said transistor of each of said third and fourth electronic switches is a field effect transistor, said third and fourth inputs each being a gate input of a respective said transistor.

13. An apparatus according to claim 9, wherein said transistor of each of said third and fourth electronic switches is a field effect transistor, said third and fourth control inputs each being a gate input of a respective said transistor.

14. An apparatus according to claim 8, wherein said first control input is coupled to said fourth control input, and said second control input is coupled to said third control input.

15. An apparatus according to claim 8, wherein said first, second and third terminals, said first, second, third and fourth electronic switches, and said first and second capacitors are included within a cellular telephone.

16. The apparatus of claim 8 wherein the first reference voltage and the second reference voltage are the same.

17. A method of switching a radio frequency signal between first and second terminals comprising:
    coupling a first electronic switch between the first and second terminals, the first electronic switch having a first control input;
    coupling a capacitor and a second electronic switch in series between the first control input and a reference voltage, the second electronic switch having a second control input;
    providing the radio frequency signal at the first terminal;
    transmitting the radio frequency signal to the second terminal by applying a first control signal to the first control input of the first electronic switch; and
    isolating the capacitor from the first electronic switch while transmitting the radio frequency signal from the first terminal to the second terminal by applying a second control signal to the second control input.

18. A method according to claim 17, including configuring each of said first and second electronic switches to include a transistor.

19. A method according to claim 18, wherein said configuring of said first electronic switch includes configuring said first electronic switch to include a field effect transistor, said first control input being a gate of said field effect transistor.

20. A method according to claim 19, wherein said configuring of said second electronic switch includes configuring said second electronic switch to include a field effect transistor, said second control input being a gate of said field effect transistor of said second electronic switch.

21. A method according to claim 18, wherein said configuring of said second electronic switch includes configuring said second electronic switch to include a field effect transistor, said second control input being a gate of said field effect transistor.

22. A method according to claim 17, wherein said providing of said second electronic switch and said capacitor is carried out so that said second electronic switch is disposed electrically between first control input and said capacitor.

23. A method according to claim 17, wherein said providing of said second electronic switch and said capacitor is carried out so that said capacitor is disposed electrically between first control input and said second electronic switch.

24. A method of controlling a circuit having first and second electronic switches coupled in series between first and second terminals, and having third terminal coupled to a node between said first and second electronic switches, said first and second electronic switches respectively having first and second control inputs, said method comprising:
providing a third electronic switch and a first capacitor which are coupled in series between said first control input and a first reference voltage;
providing a fourth electronic switch and a second capacitor which are coupled in series between said second control input and a second reference voltage;
selectively applying control voltages to each of said first, second, third and fourth control inputs; and
wherein said selectively applying said control voltages includes selectively applying a first control voltage to each of said first and fourth control inputs, and a second control voltage to each of said second and third control inputs.

25. A method according to claim 24, wherein said providing of said third and fourth electronic switches includes configuring each of said third and fourth electronic switches to include a transistor.

26. A method according to claim 24, wherein said providing of said third and fourth electronic switches includes configuring each of said third and fourth electronic switches to include a field effect transistor, each of said third and fourth control inputs being a gate input of a respective said field effect transistor.

27. A method according to claim 24, wherein said providing of said third electronic switch and said first capacitor is carried out so that said first capacitor is disposed electrically between first control input and said third electronic switch; and wherein said providing of said fourth second electronic switch and said second capacitor is carried out so that said second capacitor is disposed electrically between second control input and said fourth electronic switch.

28. A method according to claim 24, wherein said providing of said third electronic switch and said first capacitor is carried out so that said third electronic switch is disposed electrically between first control input and said first capacitor; and wherein said providing of said fourth second electronic switch and said second capacitor is carried out so that said fourth electronic switch is disposed electrically between second control input and said second capacitor.

29. The method of claim 24, wherein the first reference voltage and the second reference voltage are the same.

30. An apparatus, comprising:
first, second and third terminals;
first and second electronic switches coupled in series between said first and second terminals, said first electronic switch having a first control input and said second electronic switch having a second control input, and said third terminal being coupled to a node between said first and second electronic switches;
a first capacitor and a third electronic switch coupled in series between said first control input and a first reference voltage, said third electronic switch having a third control input;
a second capacitor and a fourth electronic switch coupled in series between said second control input and a second reference voltage, said fourth electronic switch having a fourth control input; and
a control circuit operable to effect switching of a first RF signal applied to the first terminal to the third terminal, including isolating the first capacitor from the first electronic switch, by selectively applying a first control signal to the first control input and a third control signal to the third control input, and further operable to effect switching of a second RF signal applied to the second terminal to the third terminal, including isolating the second capacitor from the second electronic switch, by selectively applying a second control signal to the second control input and a fourth control signal to the fourth control input.

31. An apparatus according to claim 30, wherein each of said electronic switches includes a transistor.

32. An apparatus according to claim 31, wherein said transistor of each of said first and second electronic switches is a field effect transistor, said first and second control inputs each being a gate input of a respective said transistor.

33. An apparatus according to claim 32,
wherein said field effect transistor of said first electronic switch has a drain coupled to said third terminal and a source coupled to said first terminal; and
wherein said field effect transistor of said second electronic switch has a drain coupled to said third terminal and a source coupled to said second terminal.

34. An apparatus according to claim 32, wherein said transistor of each of said third and fourth electronic switches is a field effect transistor, said third and fourth control inputs each being a gate input of a respective said transistor.

35. An apparatus according to claim 34,
wherein said field effect transistor of said first electronic switch has a drain coupled to said third terminal and a source coupled to said first terminal;
wherein said field effect transistor of said second electronic switch has a drain coupled to said third terminal and a source coupled to said second terminal;
wherein said field effect transistor of said third electronic switch has a drain coupled to said first control input and a source coupled to one end of said first capacitor; and
wherein said field effect transistor of said fourth electronic switch has a drain coupled to said second control input and a source coupled to one end of said second capacitor.

36. An apparatus according to claim 31, wherein said transistor of each of said third and fourth electronic switches is a field effect transistor, said third and fourth control inputs each being a gate input of a respective said transistor.

37. An apparatus according to claim 36,
wherein said field effect transistor of said third electronic switch has a drain coupled to said first control input and a source coupled to one end of said first capacitor; and
wherein said field effect transistor of said fourth electronic switch has a drain coupled to said second control input and a source coupled to one end of said second capacitor.

38. An apparatus according to claim 30, wherein said first control input is coupled to said fourth control input, and said second control input is coupled to said third control input.

39. An apparatus according to claim 30, wherein said first capacitor is disposed electrically between said first control input and said third electronic switch, and said second capacitor is disposed electrically between said second control input and said fourth electronic switch.

40. An apparatus according to claim 30, wherein said third electronic switch is disposed electrically between said first control input and said first capacitor, and said fourth electronic switch is disposed electrically between said second control input and said second capacitor.

41. An apparatus according to claim 30, wherein said first, second and third terminals, said first, second, third and fourth electronic switches, and said first and second capacitors are included within a cellular telephone.

42. A method of controlling a circuit having first and second electronic switches coupled in series between first and second terminals, said first and second terminals for receiving first and second RF signals, respectively, and having a third terminal coupled to a node between said first and second electronic switches, said first and second electronic switches respectively having first and second control inputs, said method comprising:
providing a third electronic switch and a first capacitor which are coupled in series between said first control input and a first reference voltage;
providing a fourth electronic switch and a second capacitor which are coupled in series between said second control input and a second reference voltage;
selectively applying control voltages to each of said first, second, third, and fourth control inputs; and
wherein said providing of said third electronic switch and said first capacitor is carried out so that said first capacitor is disposed electrically between first control input and said third electronic switch; and wherein said providing of said fourth second electronic switch and said second capacitor is carried out so that said second capacitor is disposed electrically between second control input and said fourth electronic switch.

43. A method of controlling a circuit having first and second electronic switches coupled in series between first and second terminals, and having a third terminal coupled to a node between said first and second electronic switches, said first and second electronic switches respectively having first and second control inputs, said method comprising:
providing a third electronic switch and a first capacitor which are coupled in series between said first control input and a first reference voltage;
providing a fourth electronic switch and a second capacitor which are coupled in series between said second control input and a second reference voltage;
applying respective RF signals to the first and second terminals;
selectively switching the respective RF signals to the third terminal by:
selectively applying a first control signal to the fist control input of the first electronic switch and selectively isolating the second capacitor from the second electronic switch by applying a third control signal to the third control input of the third electronic switch; and
selectively applying a second control signal to the second control input of the second electronic switch and selectively isolating the second capacitor from the second electronic switch by applying a fourth control signal to the fourth control input of the fourth electronic switch.

* * * * *

UNITED STATES PATENT AND TRADEMARK OFFICE
CERTIFICATE OF CORRECTION

PATENT NO.   : 6,774,701 B1
DATED        : August 10, 2004
INVENTOR(S)  : David D. Heston and John G. Heston It is certified that error appears in the above-identified patent and that said Letters Patent is hereby corrected as shown below:

Column 4,
Line 20, after "transistor 22" delete "in-a" and insert -- in a --.

Column 6,
Line 34, after "fourth" insert -- control --.

Column 7,
Line 30, after "having" insert -- a --.

Column 10,
Line 30, after "signal to the" delete "fist" and insert -- first --.

Signed and Sealed this

Twenty-eighth Day of June, 2005

JON W. DUDAS
*Director of the United States Patent and Trademark Office*